US010352999B2

United States Patent
Cheng et al.

(10) Patent No.: US 10,352,999 B2
(45) Date of Patent: *Jul. 16, 2019

(54) LOGIC ANALYZER FOR EVALUATING AN ELECTRONIC PRODUCT, METHOD OF RETRIEVING DATA OF THE SAME, AND METHOD OF PERFORMANCE TESTING

(71) Applicant: ZEROPLUS TECHNOLOGY CO., LTD., New Taipei (TW)

(72) Inventors: Chiu-Hao Cheng, New Taipei (TW); Sung-Hui Lin, Taipei (TW)

(73) Assignee: ZEROPLUS TECHNOLOGY CO., LTD., New Taipei (TW)

( * ) Notice: Subject to any disclaimer, the term of this patent is extended or adjusted under 35 U.S.C. 154(b) by 286 days.

This patent is subject to a terminal disclaimer.

(21) Appl. No.: 15/411,491

(22) Filed: Jan. 20, 2017

(65) Prior Publication Data

US 2017/0356960 A1   Dec. 14, 2017

Related U.S. Application Data

(60) Provisional application No. 62/347,966, filed on Jun. 9, 2016.

(51) Int. Cl.
  *G01R 31/3177* (2006.01)
  *G01R 31/317* (2006.01)
  *G06F 11/00* (2006.01)

(52) U.S. Cl.
  CPC ... *G01R 31/3177* (2013.01); *G01R 31/31723* (2013.01); *G01R 31/31725* (2013.01); *G06F 11/00* (2013.01)

(58) Field of Classification Search
  CPC ............... G01R 31/26; G01R 31/2603; G01R 31/2607; G01R 31/2851; G01R 31/2886;
  (Continued)

(56) References Cited

U.S. PATENT DOCUMENTS

| 8,305,903 | B1* | 11/2012 | Louise | ............ G06F 15/00 370/241 |
| 2003/0074177 | A1* | 4/2003 | Bowen | ............ G06F 17/5022 703/22 |

(Continued)

FOREIGN PATENT DOCUMENTS

| CN | 203241515 U | 10/2013 |
| TW | I500946 B | 9/2015 |

(Continued)

OTHER PUBLICATIONS

Examination report for TW105140675, dated Aug. 16, 2017, Total of 4 pages.

(Continued)

*Primary Examiner* — Kyle Vallecillo
(74) *Attorney, Agent, or Firm* — Lynette Wylie; Apex Juris, PLLC.

(57) ABSTRACT

A logic analyzer includes a probe, an FPGA module, a first transmission interface, a storage module, and a second transmission interface. A method of retrieving data includes the following steps: retrieving a digital signal through the probe, integrating the digital signal into a piece of signal data through the FPGA module, retrieving the piece of signal data through the first transmission interface, saving the piece of signal data in the storage module through the first transmission interface with a first transmission rate, returning the piece of signal data saved in the storage module to the FPGA module through the first transmission interface, receiving and transmitting the piece of signal data to the computer through the second transmission interface with a second transmission rate, whereby to save the piece of signal data therein. A method of performance testing includes testing multiple objects to correspondingly generate a (Continued)

response time triggered by a digital signal, whereby to analyze the performance of the objects.

10 Claims, 7 Drawing Sheets

(58) Field of Classification Search
    CPC ............ G01R 31/2887; G01R 31/2889; G01R 31/317; G01R 31/31723; G01R 31/31725; G01R 31/3177; G01R 1/06788; G06F 11/00; G06F 11/22; G06F 11/25
    See application file for complete search history.

(56) References Cited

U.S. PATENT DOCUMENTS

| | | | |
|---|---|---|---|
| 2003/0105620 A1* | 6/2003 | Bowen | G06F 17/5022 703/22 |
| 2004/0204923 A1* | 10/2004 | Endo | H04Q 9/00 702/189 |
| 2005/0188266 A1* | 8/2005 | Johnson | G01R 31/31905 714/30 |
| 2005/0262396 A1 | 11/2005 | Woodward et al. | |
| 2007/0288765 A1* | 12/2007 | Kean | G06F 21/76 713/193 |
| 2008/0103710 A1* | 5/2008 | Wegener | G01R 13/029 702/66 |
| 2009/0006659 A1* | 1/2009 | Collins | H04L 63/0245 710/8 |
| 2016/0004592 A1* | 1/2016 | Suzuki | G06F 11/1004 714/807 |

FOREIGN PATENT DOCUMENTS

| | | |
|---|---|---|
| TW | 201544822 A | 12/2015 |
| TW | I528042 B | 4/2016 |

OTHER PUBLICATIONS

Search report for TW105140675, dated Aug. 15, 2017, Total of 1 page.
English abstract for CN203241515 (U), Total of 1 page.
English abstract for TW201544822 (A), Total of 1 page.
English abstract for TWI500946 (B), Total of 1 page.
English abstract for TWI528042 (B), Total of 1 page.

* cited by examiner

LOGIC ANALYZER FOR EVALUATING AN ELECTRONIC PRODUCT, METHOD OF RETRIEVING DATA OF THE SAME, AND METHOD OF PERFORMANCE TESTING

BACKGROUND OF THE INVENTION

1. Technical Field

The present invention relates generally to a signal analyzer and a method thereof, and more particularly to a stable and efficient logic analyzer, a method of retrieving data thereof, and a method of performance testing.

2. Description of Related Art

In addition to joysticks made by the original (i.e., official) manufacturers of video game consoles, joysticks or adapters provided by other manufacturers are also available on the market of game accessories. However, most of these products made by non-official manufacturers have no performance information and performance analysis in comparison to the official ones, mainly because the data required for comparison and analysis is so massive that the process of comparing and analyzing would be too complicated and time-consuming. Therefore, many manufacturers get cold feet about providing related reports to persuade potential customers, even if the performance of their products is actually equivalent to, or even better than, that of the official ones. Furthermore, without such reports, the false thinking that products made by non-official manufacturers must have poorer performance cannot be refuted.

BRIEF SUMMARY OF THE INVENTION

In view of the above, the primary objective of the present invention is to provide a logic analyzer, a method of retrieving data thereof, and a method of performance testing, which could help manufacturers not only to stably and quickly analyze the capability, the stability, and the performance of their products, but also to conveniently and rapidly review the comparison results between multiple products. Furthermore, information could be recorded over long periods of time, which would be useful to determine the stability and life of each of the products while being used for a long time.

The present invention provides a logic analyzer, which is adapted to be electrically connected to an electronic product and a computer, wherein the logic analyzer includes a probe, a field-programmable gate array (FPGA) module, a first transmission interface, a storage module, and a second transmission interface. The probe is adapted to retrieve a digital signal outputted from the electronic product. The FPGA module is electrically connected to the probe, and is adapted to receive the digital signal retrieved by the probe, and to integrate the received digital signal into a piece of signal data. The first transmission interface electrically connects the FPGA module and the storage module to receive the piece of signal data outputted by the FPGA module, and to save the piece of signal data in the storage module with a first transmission rate. The second transmission interface electrically connects the FPGA module and the computer, wherein the second transmission interface is adapted to receive the piece of signal data in the storage module, which is returned to the FPGA module through the first transmission interface, and to save the piece of signal data in the computer with a second transmission rate. The second transmission rate is equal to or less than the first transmission rate.

The present invention provides a method of retrieving data, which is applied to a test system for testing an electronic product, wherein the test system comprises a logic analyzer and a computer; the logic analyzer includes a probe, an FPGA module, a storage module, a first transmission interface, and a second transmission interface wherein the method includes the following steps: A. retrieving a digital signal outputted by the electronic product through the probe; B. receiving the digital signal through the FPGA module, and converting the received digital signal into a piece of signal data, and then transmitting the piece of signal data to the first transmission interface; then, saving the piece of signal data in the storage module through the first transmission interface with a first transmission rate; C. transmitting the piece of signal data saved in the storage module to the second transmission interface through the first transmission interface, and transmitting the piece of signal data to the computer through the second transmission interface with a second transmission rate for saving and analysis. The second transmission rate is equal to or less than the first transmission rate.

The present invention provides a method of performance testing, which is applied to test performance of two objects under test, wherein the method includes the following steps: A. sending at least one first signal to the objects at the same time, once each of the objects receives each of the at least one first signal, the objects correspondingly generate a second signal and a third signal, respectively; B. retrieving the first signal, the second signal, and the third signal; C. recording a time point when step B retrieves the first signal, the second signal, and the third signal; D. calculating a time difference between the first signal and the second signal and a time difference between the first signal and the third signal according to each of the recorded time points in step C.

With the aforementioned design, the piece of signal data is written to the storage module of the logic analyzer first, and is then transmitted to the computer. Therefore, the performance of the logic analyzer would not be affected even if the computer lags, or if the transmission rate gets low. Whereby, the performance of testing could be enhanced, and data could be retrieved stably.

BRIEF DESCRIPTION OF THE SEVERAL VIEWS OF THE DRAWINGS

The present invention will be best understood by referring to the following detailed description of some illustrative embodiments in conjunction with the accompanying drawings, in which.

DETAILED DESCRIPTION OF THE INVENTION

Figure 1:
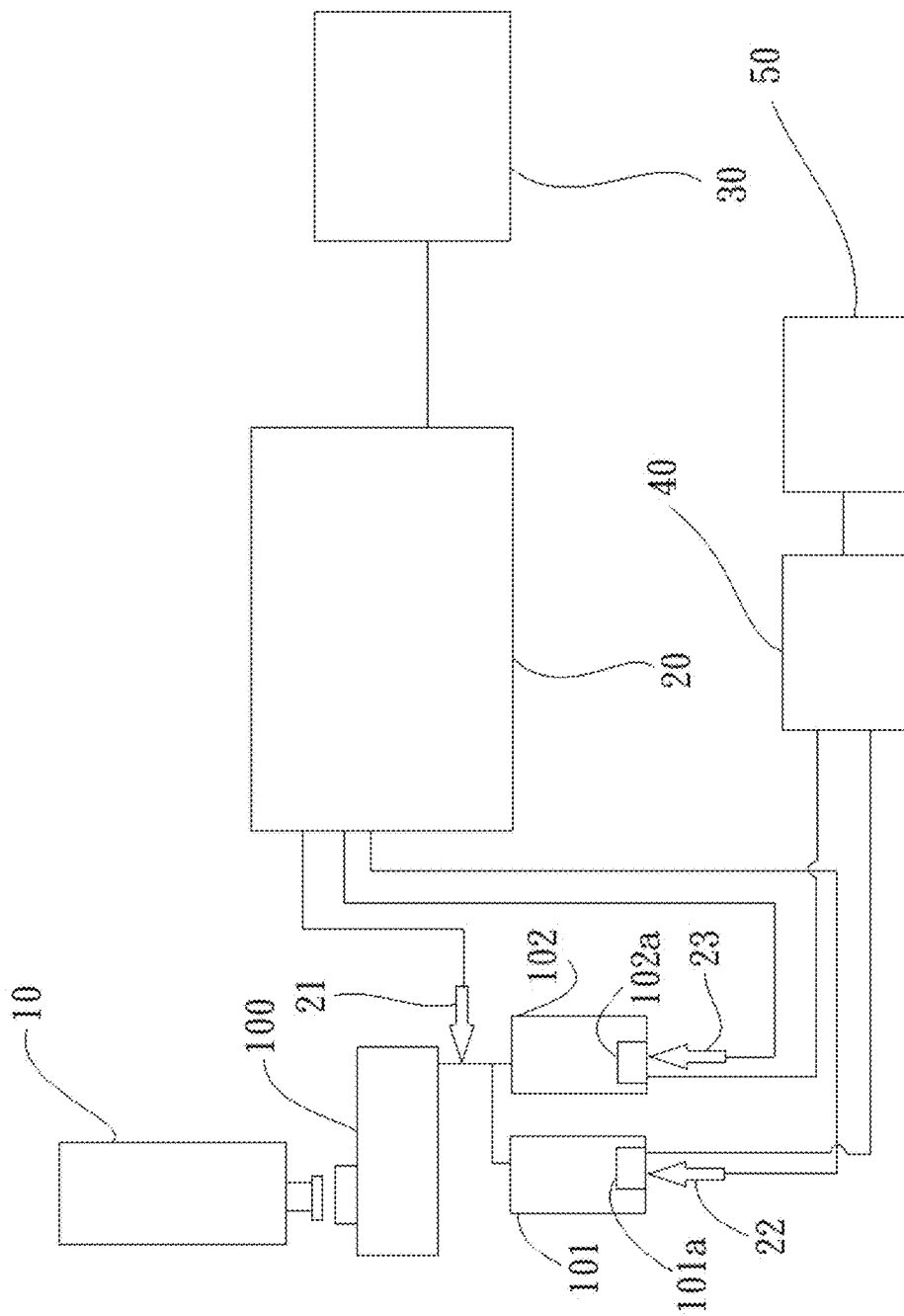
FIG. 1 is a schematic diagram, showing the test system of the logic analyzer of an embodiment of the present invention.

A test system of an embodiment of the present invention is illustrated in FIG. 1, wherein the test system is adapted to test an electronic product, and retrieve and analyze digital signals from the electronic product. In the embodiment, said electronic product is a joystick, wherein the joystick includes a user interface 100 and two driving circuit boards 101, 102 as the objects to be tested. The driving circuit boards 101, 102 are both electrically connected to the user interface 100 of the same joystick, wherein the user interface 100 includes a plurality of bottoms. Each time one of the bottoms is pressed, the user interface 100 generates a corresponding digital signal, such as surge signals, which is then transmitted to the driving circuit boards 101, 102. Once the driving circuit boards 101, 102 receive the surge signal, a corresponding digital signal, such as driving signals, will be outputted via an output terminal thereof, respectively. In the embodiment, the driving signals are digital signals following the USB communication protocol, and the output terminals of the driving circuit boards 101, 102 are USB ports 101a, 102a, respectively, which are adapted to be electrically connected to a video game console 40. The video game console 40 is electrically connected to a display 50, whereby, once the video game console 40 receives one of the driving signals, the action manipulated by the joystick can be displayed on the display 50. However, the driving signals could also follow protocols other than the USB communication protocol in other embodiments to meet different requirements in the circumstances of different circuits.

The test system includes a robotic arm 10, a logic analyzer 20, and a computer 30. The robotic arm 10 is provided above the user interface 100, and can be controlled to regularly or randomly press one of the bottoms on the user interface 100, making the user interface 100 regularly or randomly generate the surge signals.

Figure 2:
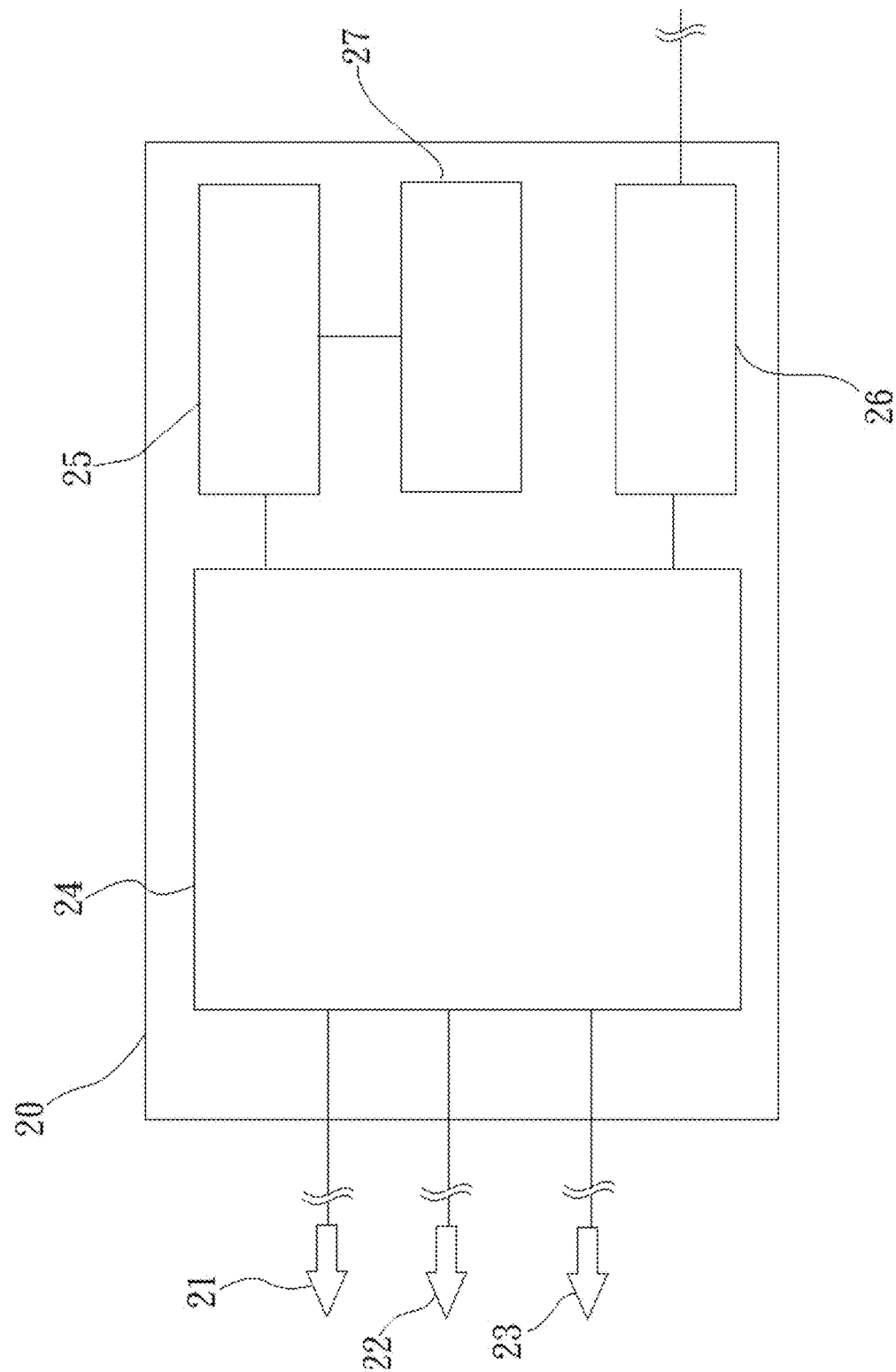
FIG. 2 and FIG. 3 are schematic diagrams, showing the logic analyzer of an embodiment of the present invention.

As shown in FIG. 2, the logic analyzer 20 includes three devices for detecting input and output signals, which are three probes 21-23 in the current embodiment, a field-programmable gate array (FPGA) module 24, a first transmission interface 25, a second transmission interface 26, and a storage module 27.

The probes 21-23 are connected to the user interface 100 and the output terminals of the driving circuit boards 101, 102, respectively, to retrieve the surge signals outputted by the user interface 100 and the driving signals outputted from the output terminals 101, 102. The surge signals retrieved from the user interface 100 are defined as first signals, while the driving signals retrieved from the driving circuit boards 101, 102 are respectively defined as second signals and third signals. The first transmission interface 25 and the storage module 27 are electrically connected, while the second transmission interface 26 and the computer 30 are electrically connected. Furthermore, a transmission rate of the second transmission interface 26 is less than or equal to that of the first transmission interface 25, wherein said transmission rate of the first transmission interface 25, which is defined as a first transmission rate, is equal to or greater than 8000 MB/s, while the transmission rate of the second transmission interface 26, which is defined as a second transmission rate, is equal to or greater than 200 MB/s. Preferably, the first transmission interface is a memory bus, of which a transmission rate is around 8000 MB/s (i.e., the first transmission rate is around 8000 MB/s), while the second transmission interface is a universal serial bus, of which a transmission rate is around 200 MB/s (i.e., a second transmission rate is around 200 MB/s).

Figure 3:
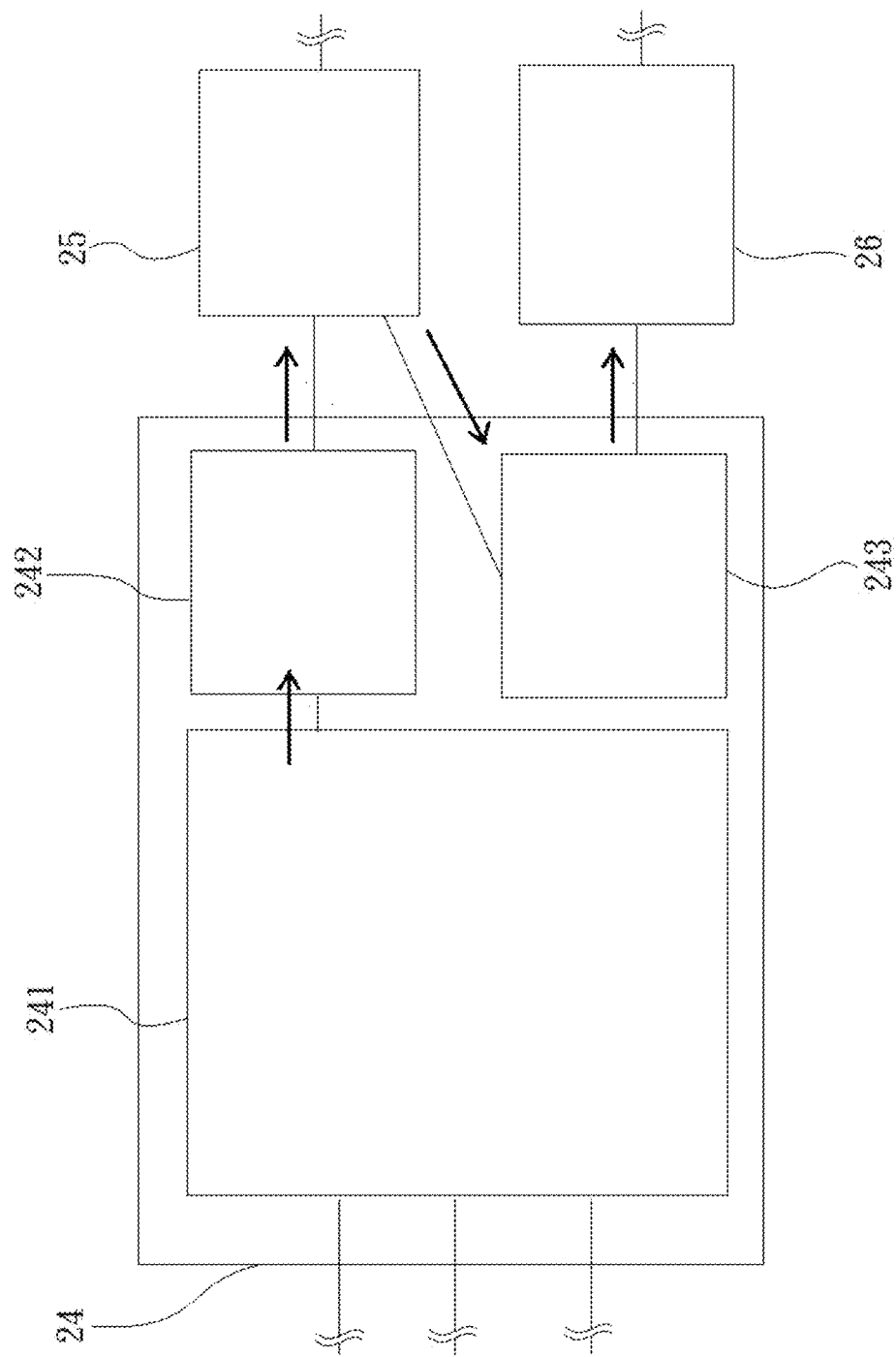

The FPGA module 24 is electrically connected to the probes 21-23, the first transmission interface 25, and the second transmission interface 26 to receive the surge signals and the driving signals retrieved by the probes 21-23, and to integrate the received surge signals and driving signals into a piece of signal data, which is to be outputted through the first transmission interface 25. More specifically, as shown in FIG. 3, the FPGA module 24 includes a converting circuit 241, a first buffer circuit 242, and a second buffer circuit 243. The converting circuit 241 is electrically connected to the probes 21-23, the first buffer circuit 242 is electrically connected to the converting circuit 241 and the first transmission interface 25, and the second buffer circuit 243 is electrically connected to the first transmission interface 25 and the second transmission interface 26. The converting circuit 241 is adapted to receive the surge signals and the driving signals retrieved by the probes 21-23, and to integrate the retrieved surge signals and driving signals into the piece of signal data, which is to be transmitted to the first buffer circuit 242. After the first buffer circuit 242 receives the piece of signal data, the first buffer circuit 242 converts the piece of signal data into a first data format receivable by the first transmission interface 25, and then transmits the piece of signal data having the first data format to the first transmission interface 25.

In the current embodiment, the storage module 27 is a part of storage areas of a double-data-rate three synchronous dynamic random access memory (DDR3 SDRAM) used in the logic analyzer 20, and is adapted to receive and save the piece of signal data outputted by the first buffer circuit 242 through the first transmission interface 25. For instance, if a memory capacity of the DDR3 SDRAM is 16 GB, 4 GB among it can be used as the storage module 27 of the current embodiment. Also, if the piece of signal data saved in the storage module 27 reaches a predetermined length, the piece of signal data will be transmitted to the second buffer circuit 243 through the first transmission interface 25. After the second buffer circuit 243 receives the piece of signal data outputted from the first transmission interface 25, the second buffer circuit 243 converts the piece of signal data into a second data format receivable by the second transmission interface 26, and transmits the piece of signal data having the second data format to the second transmission interface 26.

The computer 30 is electrically connected to the second transmission interface 26 to receive and save the piece of signal data outputted by the second buffer circuit 243 through the second transmission interface 26.

Figure 4:
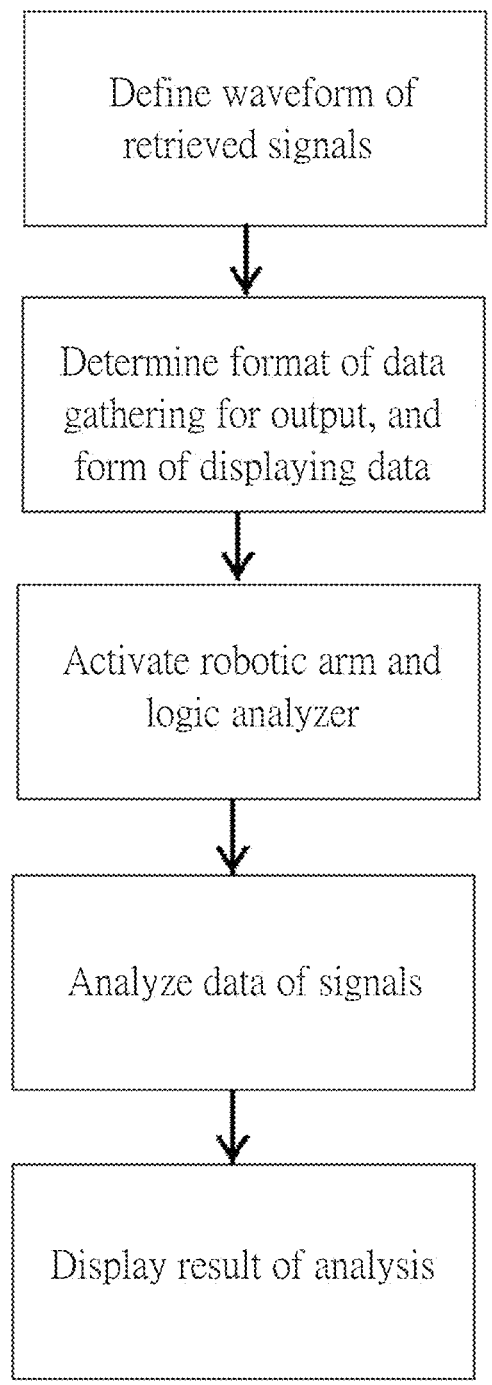
FIG. 4 is a flowchart, showing the method of retrieving and analyzing data.

With the above design, the test procedure performed by the test system could include the following steps as shown in FIG. 4:

First, define the waveform of the retrieved signals to determine the decoding method which could correspond to the communication protocol. In this step, the USB waveform, which is well-known in the industry, can be selected as the choice of the communication protocol; however, in a few cases, a user-defined signal waveform and the way of interpreting the waveform could be also acceptable. More specifically, in the current embodiment, the probe 21 is defined as an input testing probe, which is adapted to retrieve the first signals, wherein the waveform of the signals retrieved thereby is that of surge signals; on the other hand, the other two probes 22, 23 are defined as output testing probes, which are adapted to retrieve the second signals and the third signals, wherein the waveform of the signals retrieved thereby is that of USB signals. In this way, unnecessary signals (e.g., idle signals which would be periodically generated in the USB protocol) could be filtered out while retrieving signals. Whereby, only the necessary data would be sampled, which speeds up the subsequent decoding process.

Determine a format of data gathering for output, and a form of displaying data based on the waveform defined in the previous step. In this step, the format could be selected out from multiple standard formats; or, the format of data gathering and the form of displaying data could also be user-defined, which provides more flexibility in use.

Activate the robotic arm 10 and the logic analyzer 20. More specifically, after activating the robotic arm 10, the robotic arm 10 regularly or randomly presses at least one predetermined bottom on the user interface 100, making the user interface 100 regularly or randomly generate the surge signals (i.e., the first signals) according to the action of the robotic arm 10. Consequently, the output terminals of the driving circuit boards 101, 102 output the corresponding driving signals (i.e., the second signals and the third signals), respectively. And then, the activated logic analyzer 20 starts to retrieve the surge signals and the driving signals through the probes 21-23. In the embodiment, by randomly operating the robotic arm 10 at different time points, the user interface 100 would send a plurality of surge signals to the driving circuit boards 101, 102, wherein each of the surge signals is sent at different time points for the subsequent testing.

After the probes 21-23 retrieves the surge signals and the driving signals, the converting circuit 241 of the FPGA module 24 converts the retrieved signals into the piece of signal data, and then transmits the piece of signal data to the first buffer circuit 242, so that the piece of signal data can be transmitted to the storage module 27 and saved therein through the first transmission interface 25. Once the piece of signal data saved in the storage module 27 reaches the predetermined length (e.g., 4 GB), the piece of signal data of the predetermined length in the storage module 27 is outputted to the second buffer circuit 243 through the first transmission interface 25. Whereby, the piece of signal data can be transmitted to the computer 30 through the second transmission interface 26 for storage and analysis. In addition, since the file of the piece of signal data generated by the FPGA module 24 of the logic analyzer 20 is too large to be saved in a memory of the computer 30, the file has to be saved in a hard drive of the computer 30. In addition, when the computer 30 saves the piece of signal data, it is evenly divided into files of the same size according to the order of saving.

With the abovementioned design of the communication path of the piece of signal data, even if the computer 30 lags for some problems in the operating system, or the transmission rate is lowered somehow, the piece of signal data still gets saved in the storage module 27 of the logic analyzer 20 first, and then is transferred to the computer 30 after being outputted by the storage module 27. In this way, even if the computer 30 lags or has low transmission rate, the test and transmission of the logic analyzer would not be affected, which could ease related commonly seen problems in the industry. In more details, a conventional logic analyzer would directly output the piece of signal data to the computer after retrieving signals. Therefore, if the computer lags or has low transmission rate, the transmission rate or the data storage rate of the computer might be unable to catch up the retrieving rate of the conventional logic analyzer. As a result, the system would stop testing because of the errors. In other words, with the above-mentioned design of the circuits and data transmission, the objective of stable data retrieval over long periods of time could be effectively achieved.

Figure 5:
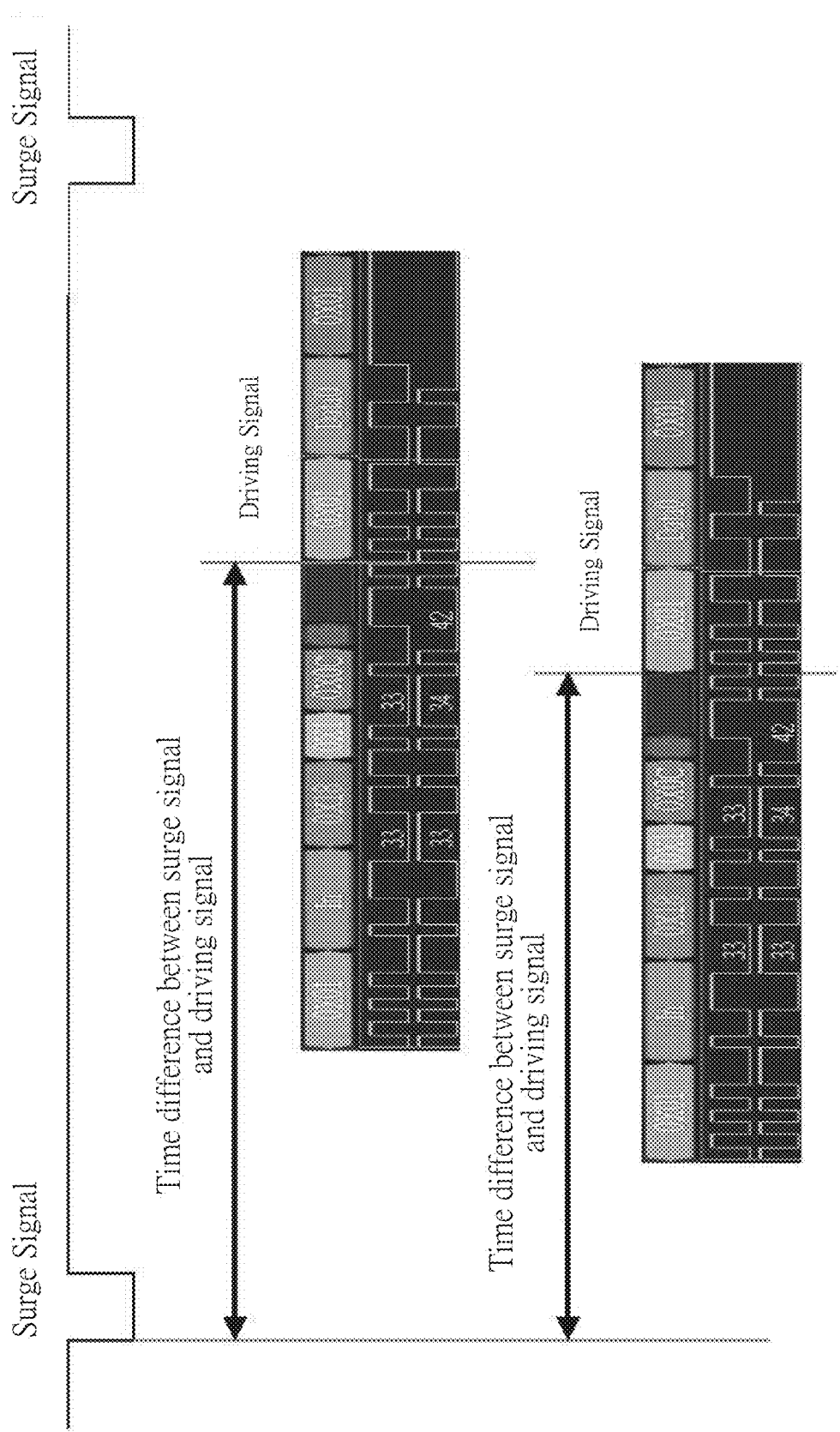
FIG. 5 is a schematic diagram, showing the waveform of two driving signals generated in the period of two surge signals.

Once the piece of signal data is saved in the computer 30, the saved piece of signal data could be analyzed to test and evaluate the performance of the objects under test (i.e., the driving circuit boards 101, 102). As shown in FIG. 5, the content of the saved piece of signal data would be accessed and interpreted, whereby to obtain the time points of the signals retrieved by the input testing probe 21 (i.e., the surge signals) and the signals retrieved by the output testing probes 22, 23 (i.e., the driving signals), and the time differences between their time points. It is worth mentioning that, since the piece of signal data is divided into files while being saved, the computer 30 does not have to access a great amount of the piece of signal data at once for comparison and analysis, which effectively speeds up the accessing and analyzing process of the computer 30. In addition, in the current embodiment, the comparison of the time differences between the surge signals and the driving signals would be made by searching two surge signals which come out in a row, and looking for the time point at which each of the driving signals is generated within the period between these two surge signals. In this way, the time difference between the first surge signal and each of the driving signals could be obtained.

Also, in the current embodiment, the computer 30 accesses and interprets the piece of signal data according to the features corresponding to the communication protocol defined in the previous steps (i.e., every USB signal which contains data always has a specific type of waveform at the beginning thereof), which means, the computer 30 checks whether the features appear in the piece of signal data while accessing the piece of signal data, wherein only the signals having matched features will be interpreted. Whereby, the overall data processing rate would be enhanced.

In addition, in the current embodiment, the computer 30 accesses and analyzes data either byte-by-byte (i.e., 8 bits) or two-bytes-by-two-bytes (i.e., 16 bits), which is different from the conventional way (bit-by-bit). Whereby, the data processing rate could be enhanced.

Also, wherever possible, the program executed by the computer 30 to access and interpret signals would use a table-lookup algorithm for interpreting signals instead of using the "If_Then_Else" condition statement which consumes more processor cycles. By using a table-lookup algorithm, the program could avoid consuming too many processor cycles, which would effectively increase the data processing rate.

Figure 6:
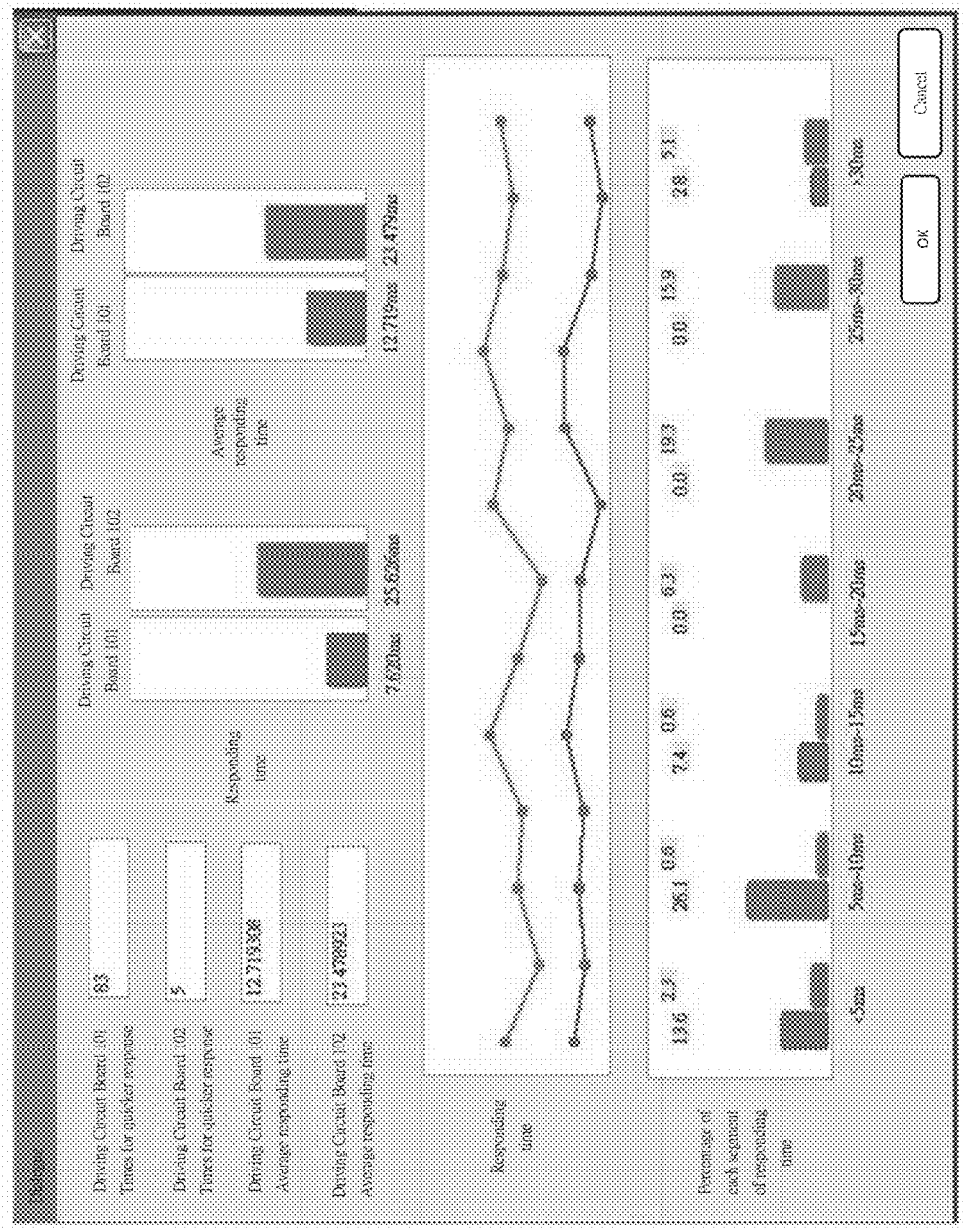
FIG. 6 is a schematic diagram, showing the result of analysis outputted according to the determined format of data gathering and the determined form of displaying the data.

At last, as shown in FIG. 6, after the computer 30 analyzes the saved piece of signal data, the result could be outputted based on the determined format of data gathering, and could be displayed on the display of the computer 30 according to the determined form of displaying data. With the result of analysis, the time required for each of the driving circuit boards 101, 102 to output the corresponding driving signal after the tested joystick generating one surge signal could be obtained, which could be used to evaluate the performance of data processing and data converting for each of the driving circuit boards 101, 102. Furthermore, by retrieving data for comparing and analyzing over a long period, the stability and life of each of the driving circuit boards 101, 102 could be evaluated as well.

It must be noted that, the design mentioned above is not only adapted to be applied to test the performance of joysticks, but also suitable for other electronic products. Furthermore, by checking the variations of the inputted data and the corresponding outputted data over a long period, the key points of the variations (e.g., slight or serious lag) could be further recognized. What's more, among multiple sets of results, one set could be designated as a baseline, which could be compared with other comparing results. Whereby, the performance of different products could be sufficiently and quickly evaluated. In this way, products with poor performance could be effectively filtered out. The statistics information for the distribution of the response times between inputs and outputs could be further utilized to better determine the operating efficiency of corresponding products. Afterward, a distribution graph of the quality of products could be further made as a reference to improve future products.

In addition, the type of said first signals, said second signals, and said third signals are not a limitation of the present invention. In other embodiments, other types of signals could be defined as the first signals, the second signals, and the third signals depending on the electronic product, the object to be tested, or the testing condition.

Figure 7:
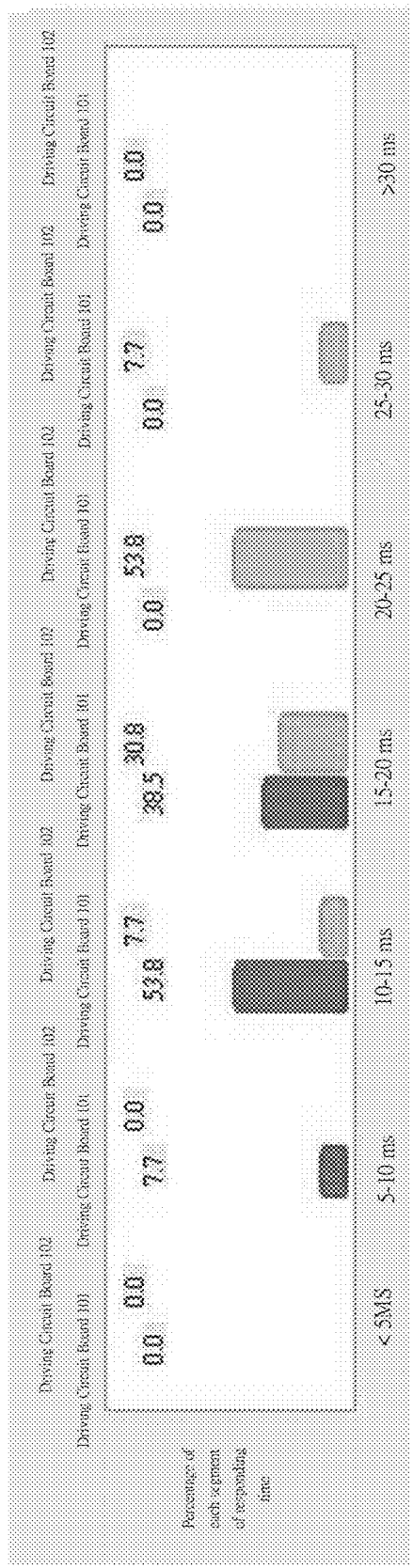
FIG. 7 is a diagram, showing the distribution of the ratio of the response time of each of the driving circuit boards in each time segment.

Furthermore, as shown in FIG. 7, with the design mentioned above, the diagram showing the distribution of the ratio of the response time of each of the driving circuit boards 101, 102 in each time segment could also be drawn, whereby the distribution of the lag time of each driving circuit board could be shown. Take FIG. 7 for example, the longest lag time of the driving circuit board 101 falls within the segment of 15-20 ms. By knowing this, the causes could be traced and analyzed, which would be helpful for adjusting the detailed design of the products, and therefore the performance of the products could be enhanced in all aspects.

It must be pointed out that the embodiments described above are only some preferred embodiments of the present invention. All equivalent structures and methods which employ the concepts disclosed in this specification and the appended claims should fall within the scope of the present invention.

What is claimed is:

1. A logic analyzer, which is adapted to be electrically connected to an electronic product and a computer; comprising:
   a probe, which is adapted to retrieve a digital signal outputted from the electronic product;
   a field-programmable gate array (FPGA) module, which is electrically connected to the probe, and is adapted to receive the digital signal retrieved by the probe, and to integrate the received digital signal into a piece of signal data;
   a first transmission interface and a storage module, wherein the first transmission interface electrically connects the FPGA module and the storage module to receive the piece of signal data outputted by the FPGA module, and to save the piece of signal data in the storage module with a first transmission rate; and
   a second transmission interface, which electrically connects the FPGA module and the computer, wherein the second transmission interface is adapted to receive the piece of signal data in the storage module, which is returned to the FPGA module through the first transmission interface, and to save the piece of signal data in the computer with a second transmission rate, and the second transmission rate is equal to or less than the first transmission rate.

2. The logic analyzer of claim 1, wherein once the FPGA module senses that the piece of signal data saved in the storage module reaches a predetermined length, the FPGA module controls the storage module to transmit the piece of signal data to the computer.

3. The logic analyzer of claim 1, wherein the first transmission rate is equal to or greater than 8000 MB/s, while the second transmission rate is equal to or greater than 200 MB/s.

4. The logic analyzer of claim 1, wherein the FPGA module comprises a converting circuit, a first buffer circuit, and a second buffer circuit; the converting circuit is electrically connected to the probe, and is adapted to integrate the received digital signal into the piece of signal data; the first buffer circuit is electrically connected to the converting circuit and the first transmission interface, wherein the first buffer circuit is adapted to receive and convert the piece of signal data into a first data format, and then transmits the piece of signal data having the first data format to the first transmission interface; the second buffer circuit is electrically connected to the first transmission interface and the second transmission interface, wherein the second buffer circuit is adapted to receive and convert the piece of signal data outputted by the first transmission interface into a second data format, and then transmits the piece of signal data having the second data format to the second transmission interface.

5. A method of retrieving data, which is applied to a test system for testing an electronic product, wherein the test system comprises a logic analyzer and a computer; the logic analyzer comprises a probe, an FPGA module, a storage module, a first transmission interface, and a second transmission interface; comprising:
   A. retrieving a digital signal outputted by the electronic product through the probe;
   B. receiving the digital signal through the FPGA module, and converting the received digital signal into a piece of signal data, and then transmitting the piece of signal data to the first transmission interface; then, saving the piece of signal data in the storage module through the first transmission interface with a first transmission rate; and
   C. transmitting the piece of signal data saved in the storage module to the second transmission interface through the first transmission interface, and transmitting the piece of signal data to the computer through the second transmission interface with a second transmission rate for saving and analysis, wherein the second transmission rate is equal to or less than the first transmission rate.

6. The method of claim 5, wherein, in step C, the piece of signal data saved in the storage module is returned to the FPGA module through the first transmission interface, and is then transmitted to the computer through the second transmission interface.

7. The method of claim 5, wherein step C is not taken until the piece of signal data saved in the storage module reaches a predetermined length after step B.

8. A logic analyzer, which is adapted to be electrically connected to an electronic product and a computer; comprising:
   a probe, which is adapted to retrieve a digital signal outputted from the electronic product;
   a field-programmable gate array (FPGA) module, which is electrically connected to the probe, and is adapted to receive the digital signal retrieved by the probe, and to integrate the received digital signal into a piece of signal data;

a first transmission interface and a storage module, wherein the first transmission interface electrically connects the FPGA module and the storage module to receive the piece of signal data outputted by the FPGA module, and to save the piece of signal data in the storage module with a first transmission rate; and a second transmission interface, which electrically connects the FPGA module and the computer, wherein the second transmission interface is adapted to receive the piece of signal data in the storage module, which is returned to the FPGA module through the first transmission interface, and to save the piece of signal data in the computer with a second transmission rate;

wherein the FPGA module comprises a converting circuit, a first buffer circuit, and a second buffer circuit; the converting circuit is electrically connected to the probe, and is adapted to integrate the received digital signal into the piece of signal data; the first buffer circuit is electrically connected to the converting circuit and the first transmission interface, wherein the first buffer circuit is adapted to receive and convert the piece of signal data into a first data format, and then transmits the piece of signal data having the first data format to the first transmission interface; the second buffer circuit is electrically connected to the first transmission interface and the second transmission interface, wherein the second buffer circuit is adapted to receive and convert the piece of signal data outputted by the first transmission interface into a second data format, and then transmits the piece of signal data having the second data format to the second transmission interface.

9. The logic analyzer of claim 8, wherein once the FPGA module senses that the piece of signal data saved in the storage module reaches a predetermined length, the FPGA module controls the storage module to transmit the piece of signal data to the computer.

10. The logic analyzer of claim 8, wherein the second transmission rate is equal to or less than the first transmission rate, and the first transmission rate is equal to or greater than 8000 MB/s, while the second transmission rate is equal to or greater than 200 MB/s.

* * * * *